United States Patent
Yamazaki et al.

(10) Patent No.: US 10,891,575 B2
(45) Date of Patent: Jan. 12, 2021

(54) FACILITY CONFIGURATION CREATION SUPPORT SYSTEM AND FACILITY CONFIGURATION CREATION SUPPORT METHOD

(71) Applicant: Panasonic Intellectual Property Management Co., Ltd., Osaka (JP)

(72) Inventors: Takuya Yamazaki, Fukuoka (JP); Hirokazu Takehara, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 215 days.

(21) Appl. No.: 15/814,837

(22) Filed: Nov. 16, 2017

(65) Prior Publication Data

US 2018/0150782 A1  May 31, 2018

(30) Foreign Application Priority Data

Nov. 30, 2016  (JP) .................................. 2016-232594

(51) Int. Cl.
 *G06Q 10/06* (2012.01)
 *G06Q 10/04* (2012.01)
 *G06F 30/13* (2020.01)

(52) U.S. Cl.
 CPC ....... *G06Q 10/06375* (2013.01); *G06F 30/13* (2020.01); *G06Q 10/04* (2013.01); *G06Q 10/0633* (2013.01); *G06Q 10/06312* (2013.01)

(58) Field of Classification Search
 CPC ............. G06Q 10/06375; G06Q 10/04; G06Q 10/06312; G06Q 10/0633; G06F 17/5004; G06F 4/20
 See application file for complete search history.

(56) References Cited

U.S. PATENT DOCUMENTS 5,249,120 A * 9/1993 Foley .................... G06Q 10/06
 705/1.1
5,258,915 A * 11/1993 Billington ............ H05K 13/085
 700/103

(Continued)

FOREIGN PATENT DOCUMENTS

JP   10-240806   *   9/1998
JP   H10-240806 A       9/1998

(Continued)

OTHER PUBLICATIONS

Mehrabi, Mostafa G., A. Galip Ulsoy, and Yoram Koren. "Reconfigurable manufacturing systems: Key to future manufacturing." Journal of Intelligent manufacturing 11.4 (2000): 403-419. (Year: 2000).*

(Continued)

*Primary Examiner* — Matthew S Gart
*Assistant Examiner* — Hamzeh Obaid
(74) *Attorney, Agent, or Firm* — Pearne & Gordon LLP

(57) ABSTRACT

A facility configuration creation support method which supports creation of a facility configuration of a component mounting line which includes a component mounter includes a facility configuration creation step of creating a new facility configuration in which a total cost is reduced as compared to a current total cost in continuing production with a current facility configuration when producing in a specific period in the component mounting line.

9 Claims, 5 Drawing Sheets

(56) References Cited

U.S. PATENT DOCUMENTS

| | | | | |
|---|---|---|---|---|
| 5,966,694 | A * | 10/1999 | Rothschild | G06Q 10/0639 705/7.37 |
| 7,698,013 | B2 * | 4/2010 | Honda | G05B 19/41865 700/116 |
| 2002/0083026 | A1 * | 6/2002 | Eshelman | G06N 3/126 706/14 |
| 2004/0078310 | A1 * | 4/2004 | Shaffer | G06Q 10/06 705/35 |
| 2004/0153868 | A1 * | 8/2004 | Nonaka | G06Q 10/10 714/47.2 |
| 2007/0293969 | A1 * | 12/2007 | Hirai | H05K 13/0885 700/114 |
| 2010/0030357 | A1 * | 2/2010 | Tilove | G06Q 10/06 700/100 |
| 2014/0108773 | A1 * | 4/2014 | Jagatheesan | G06F 12/0653 713/1 |
| 2014/0135982 | A1 * | 5/2014 | Majima | G05B 19/4182 700/247 |
| 2016/0021803 | A1 | 1/2016 | Iwata et al. | |
| 2016/0274569 | A1 * | 9/2016 | Peng | G05B 19/41845 |

FOREIGN PATENT DOCUMENTS

| | | |
|---|---|---|
| JP | 2004-054358 A | 2/2004 |
| JP | 2006-031360 A | 2/2006 |
| JP | 2016-024610 A | 2/2016 |
| JP | 2016-025131 A | 2/2016 |

OTHER PUBLICATIONS

Hahn, Peter O. "The 300 mm silicon wafer—a cost and technology challenge." Microelectronic Engineering 56.1-2 (2001): 3-13. (Year: 2001).*

Michalek, Jeremy J., et al. "Balancing marketing and manufacturing objectives in product line design." (2006): 1196-1204. (Year: 2006).*

Mok, P. Y. "A decision support system for the production control of a semiconductor packaging assembly line." Expert Systems with Applications 36.3 (2009): 4423-4430. (Year: 2009).*

* cited by examiner

FACILITY CONFIGURATION CREATION SUPPORT SYSTEM AND FACILITY CONFIGURATION CREATION SUPPORT METHOD

BACKGROUND

1. Technical Field

The present disclosure relates to a facility configuration creation support system and a facility configuration creation support method which support the creation of a facility configuration of a component mounting line.

2. Description of the Related Art

In a component mounting line which is configured by connecting a plurality of production facilities such as a component mounter which mounts components on a board, mounting boards of various board types are produced. When newly designing a production system such as a component mounting line, changing an existing production system, or the like, facility configurations are considered so as to satisfy a target productivity and a target facility investment cost. In the related art, there is proposed a system which automatically creates an optimal facility configuration in a production system (for example, refer to Japanese Patent Unexamined Publication No. 2006-31360).

In Japanese Patent Unexamined Publication No. 2006-31360, the facilities with which the productivity and the facility investment cost are optimal are automatically selected with respect to a production plan of a production system which is set in advance.

SUMMARY

The facility configuration creation support system of the present disclosure is a facility configuration creation support system which supports creation of a facility configuration of a component mounting line which includes a component mounter, the facility configuration creation support system including a facility configuration creator which creates a new facility configuration in which a total cost is reduced as compared to a current total cost in continuing production with a current facility configuration when producing in a specific period in the component mounting line, and a management storage which stores the facility configuration which is created by the facility configuration creator.

The facility configuration creation support method of the present disclosure is a facility configuration creation support method which supports creation of a facility configuration of a component mounting line which includes a component mounter, the method including a facility configuration creation step of creating a new facility configuration in which a total cost is reduced as compared to a current total cost in continuing production with a current facility configuration when producing in a specific period in the component mounting line, and a storage step of storing the facility configuration which is created in the facility configuration creation step.

According to the present disclosure, it is possible to support the creation of a facility configuration in which the cost may be reduced as compared to the current total cost in the current component mounting line.

DETAILED DESCRIPTION

Before describing the embodiment, a concise description will be given of the problems in the related art.

In the technique of the related art including Japanese Patent Unexamined Publication No. 2006-31360, a new facility configuration that satisfies a target value is determined on the premise of changing the facility configuration, and as compared to a case in which the production is continued with the current facility configuration, there is a problem in that it is unclear whether or not the cost is actually reduced after changing the facility configuration.

Therefore, an object of the present disclosure is to provide a facility configuration creation support system and a facility configuration creation support method which are capable of supporting the creation of a facility configuration which is capable of reducing costs from the current component mounting line.

Figure 2:
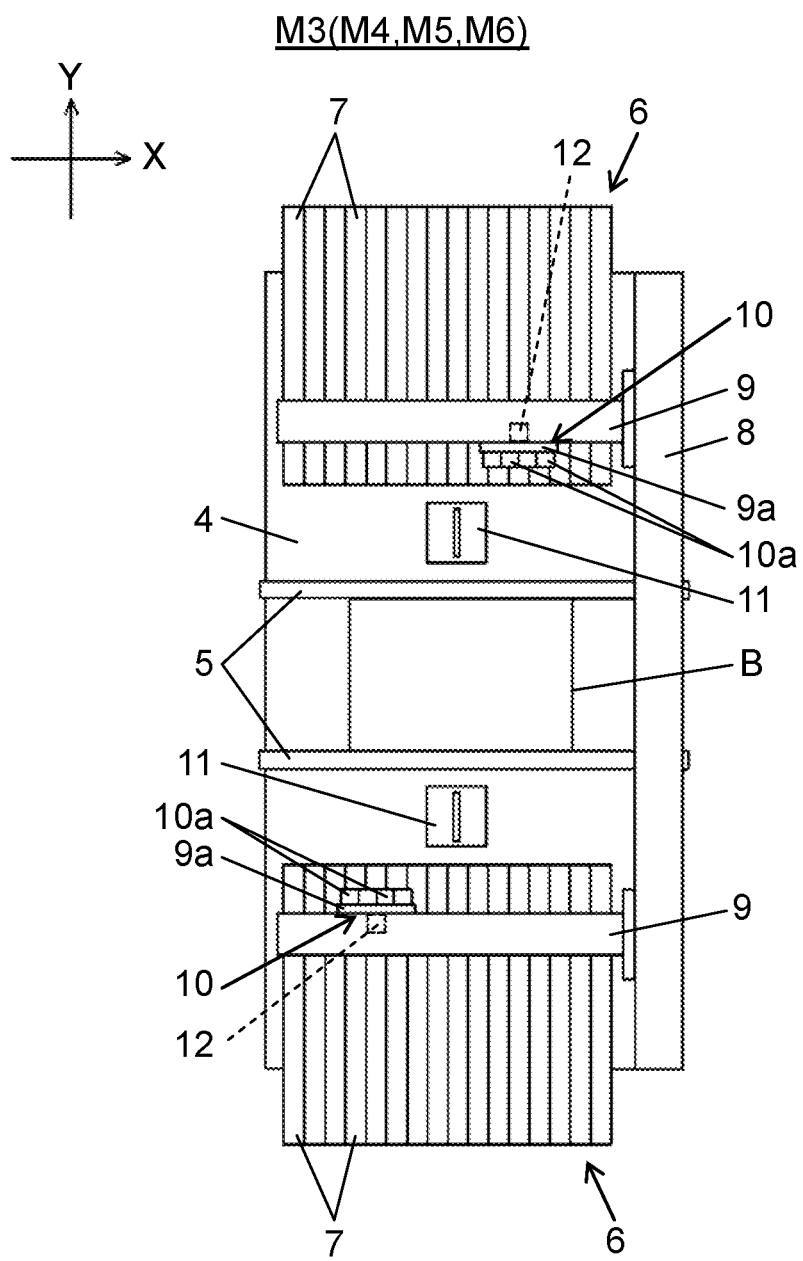
FIG. 2 is a plan view of a component mounter with which the component mounting system of an embodiment of the present disclosure is provided.

Hereinafter, a detailed description will be given of an embodiment of the present disclosure using the drawings. The configurations, forms, and the like which are described hereinafter are examples to facilitate the explanation, and may be modified, as appropriate, according to the design of the component mounting system, the component mounting line, the component mounter, and the management computer. Hereinafter, elements corresponding to each other are given the same symbols in all of the drawings and duplicated description is omitted. In FIG. 2, an X direction (a left-right direction in FIG. 2) of a board transport direction and a Y direction (an up-down direction in FIG. 2) which is perpendicular to the board transport direction are illustrated as two axial directions which are perpendicular to each other within a horizontal plane.

Figure 1:
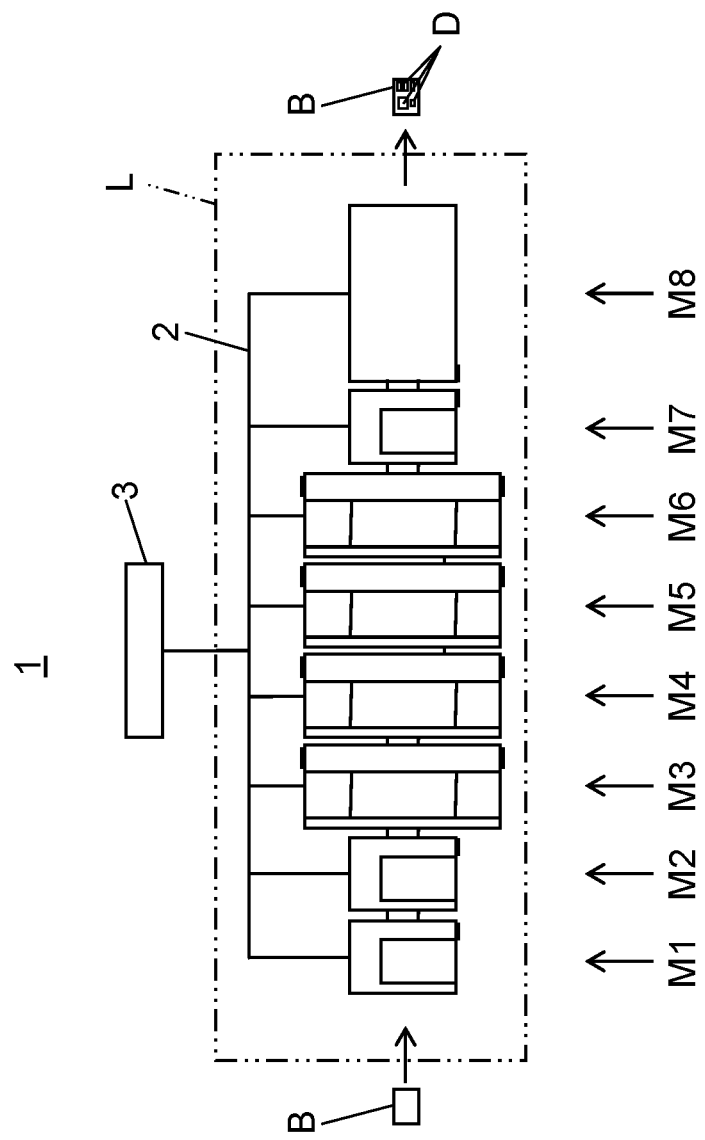
FIG. 1 is an explanatory diagram of the configuration of a component mounting system of an embodiment of the present disclosure.

First, a description will be given of the configuration of component mounting system 1 with reference to FIG. 1. Component mounting system 1 is configured such that component mounting line L is connected by communication network 2 and is managed by management computer 3.

Component mounting line L is configured by connecting, in series from an upstream side (a paper surface left side) in the board transport direction toward a downstream side (a paper surface right side), devices for component mounting such as solder printer M1, print inspector M2, component mounters M3 to M6, mounting inspector M7, and reflow device M8.

Solder printer M1, print inspector M2, component mounters M3 to M6, mounting inspector M7, and reflow device M8 are connected to management computer 3 via communication network 2. Solder printer M1 performs solder printing work in which a solder printing work unit is used to print solder via a mask onto board B which is carried in from the upstream side. Print inspector M2 performs print inspection work in which a print inspection working unit including a solder inspection camera is used to inspect the state of the solder which is printed on board B.

Component mounters M3 to M6 perform component mounting work in which a component mounting work unit is used to mount components D onto board B. Component mounting line L is not limited to a configuration in which there are four of component mounters M3 to M6, and the number of component mounters M3 to M6 may be one to three or greater than or equal to five. In other words, component mounting line L includes component mounters M3 to M6. Mounting inspector M7 performs mounting inspection work in which a mounting inspection work unit including a component inspection camera is used to inspect the state of components D which are mounted on board B. Reflow device M8 performs board heating work in which a board heater is used to heat board B which is carried into the device, the solder on board B is cured, and electrode portions of board B and components D are bonded.

Next, description will be given of the configuration of component mounters M3 to M6 with reference to FIG. 2. Component mounters M3 to M6 have the same configuration, and here, description will be given of component mounter M3. Component mounter M3 has a function of mounting components D onto board B.

In FIG. 2, board transport mechanism 5 is arranged in the X direction at the center of table 4. Board transport mechanism 5 transports board B which is carried in from the upstream side and positions board B at a position for performing the component mounting work. Component supplier 6 is disposed on each side of board transport mechanism 5. A plurality of tape feeders 7 is disposed on each component supplier 6 such that tape feeders 7 line up in the X direction. Tape feeders 7 supply components D to component pick-up positions of a mounting head of a component mounting mechanism (described later) by pitch feeding carrier tapes which store components D in a tape feed direction.

It is possible to dispose tray feeders (not illustrated) which supply trays that store a plurality of components D to the component pick-up positions instead of tape feeders 7 in component supplier 6 or in a configuration coexisting with tape feeders 7. Tape feeders 7 and the tray feeders are component supply devices which supply components D to the component pick-up positions. Whether to dispose tape feeders 7 or to dispose the tray feeders in component suppliers 6 as the component supply devices is changed freely according to the type, size, and the like of components D to be supplied.

Y-axis beam 8 which is provided with a linear drive mechanism is arranged along the Y direction on the end portion of one side in the X direction on the top surface of table 4. Two X-axis beams 9 similarly provided with linear drive mechanisms are joined to Y-axis beam 8 to move freely in the Y direction. X-axis beams 9 are arranged along the X direction. Mounting head 10 is installed on each of two X-axis beams 9 to move freely in the X direction. Each mounting head 10 is provided with a plurality of suction units 10a which suction hold components D and are capable of being lifted and lowered. A suction nozzle (not illustrated) is installed on the distal end of each suction unit 10a.

Types of mounting head 10 which are provided with different numbers of suction units 10a and have different shapes and sizes of suction unit 10a are prepared and it is possible to freely exchange and install mounting heads 10 on X-axis beam 9. When the number of suction units 10a which are provided is great, since the number of components D which may be sucked by mounting head 10 at the same time increases, it is possible to shorten the component mounting time. In a case in which large components D are sucked, mounting head 10 in which suction units 10a are few and the size of suction units 10a is great is used. In this manner, the types of mounting heads 10 to be installed on component mounter M3 are freely selected according to the type, size, and the like of components D to be sucked.

In FIG. 2, each mounting head 10 moves in the X direction and the Y direction due to Y-axis beam 8 and corresponding X-axis beam 9 being driven. Accordingly, using suction nozzles, two mounting heads 10 suck and pick up components D from the component pick-up positions of tape feeders 7 which are disposed on component suppliers 6 corresponding to each mounting head 10 and mount components D onto mounting points on board B which is positioned in board transport mechanism 5. Y-axis beam 8, X-axis beams 9, and mounting heads 10 configure the component mounting mechanism which mounts components D onto board B by moving mounting heads 10 which hold components D.

Each component recognition camera 11 is arranged between a corresponding pair of component supplier 6 and board transport mechanism 5. When mounting heads 10 which pick up components D from component suppliers 6 move above component recognition cameras 11, component recognition cameras 11 image components D in the state of being held by mounting heads 10 and recognize the holding orientations of components D. Board recognition camera 12 is attached to each plate 9a to which each mounting head 10 is attached. Each board recognition camera 12 moves integrally with corresponding mounting head 10.

Due to the movement of mounting heads 10, board recognition cameras 12 move above board B which is positioned in board transport mechanism 5 and board recognition cameras 12 image board marks (not illustrated) which are provided on board B to recognize the position of board B. In a component mounting operation of board B carried out by each mounting head 10, mounting position correction is performed, taking into account the recognition results of component D by component recognition camera 11 and the recognition results of the board position by board recognition camera 12.

In this manner, in component mounter M3, board transport mechanism 5, component mounting mechanism (Y-axis beam 8, X-axis beams 9, and mounting heads 10), component recognition cameras 11, and board recognition camera 12 configure component mounting work unit 13 (refer to FIG. 3) which transports board B and mounts components D which are supplied by component supplier 6 onto board B which is transported.

Next, a description will be given of the configuration of the control system of component mounting system 1 with reference to FIG. 3. Component mounters M3 to M6 with which component mounting line L is provided have the same configuration, and hereinafter, a description will be given of component mounter M3.

Component mounter M3 is provided with mounting controller 21, mounting storage 22, component suppliers 6, component mounting work unit 13, and communicator 23. Communicator 23 is a communication interface and performs the transaction of signals and data between other component mounters M4 to M6 and management computer 3 via communication network 2. Mounting controller 21 controls tape feeders 7 which are installed on component suppliers 6 and component mounting work unit 13 based on the component mounting data which is stored by mounting storage 22 to cause component mounter M3 to perform the component mounting work.

Management computer 3 is provided with management controller 31, management storage 32, input unit 33, display unit 34, and communicator 35. Input unit 33 is an input device such as a keyboard, a touch panel, a mouse, or the like and is used for operation commands, during data input, and the like. Display unit 34 is a display device such as a liquid crystal panel and displays various information such as an operation screen for the operations which are carried out using input unit 33. Communicator 35 is a communication interface and performs the transaction of signals and data between component mounters M3 to M6 of component mounting line L via communication network 2.

Management controller 31 is a computation device such as a CPU and manages component mounting system 1 based on information which is stored by management storage 32. Management controller 31 is provided with production time predictor 31a, facility availability predictor 31b, worker number predictor 31c, facility configuration changer 31d, cost calculator 31e, and cost determination unit 31f as internal processing functions. Management storage 32 is a storage device and stores mounting data 32a, production plan information 32b, current facility configuration information 32c, new facility configuration information 32d, production time information 32e, facility availability information 32f, worker number information 32g, cost reduction target information 32h, unit cost information 32i, facility stopping time information 32j, calculated cost information 32k, and the like.

Figure 3:
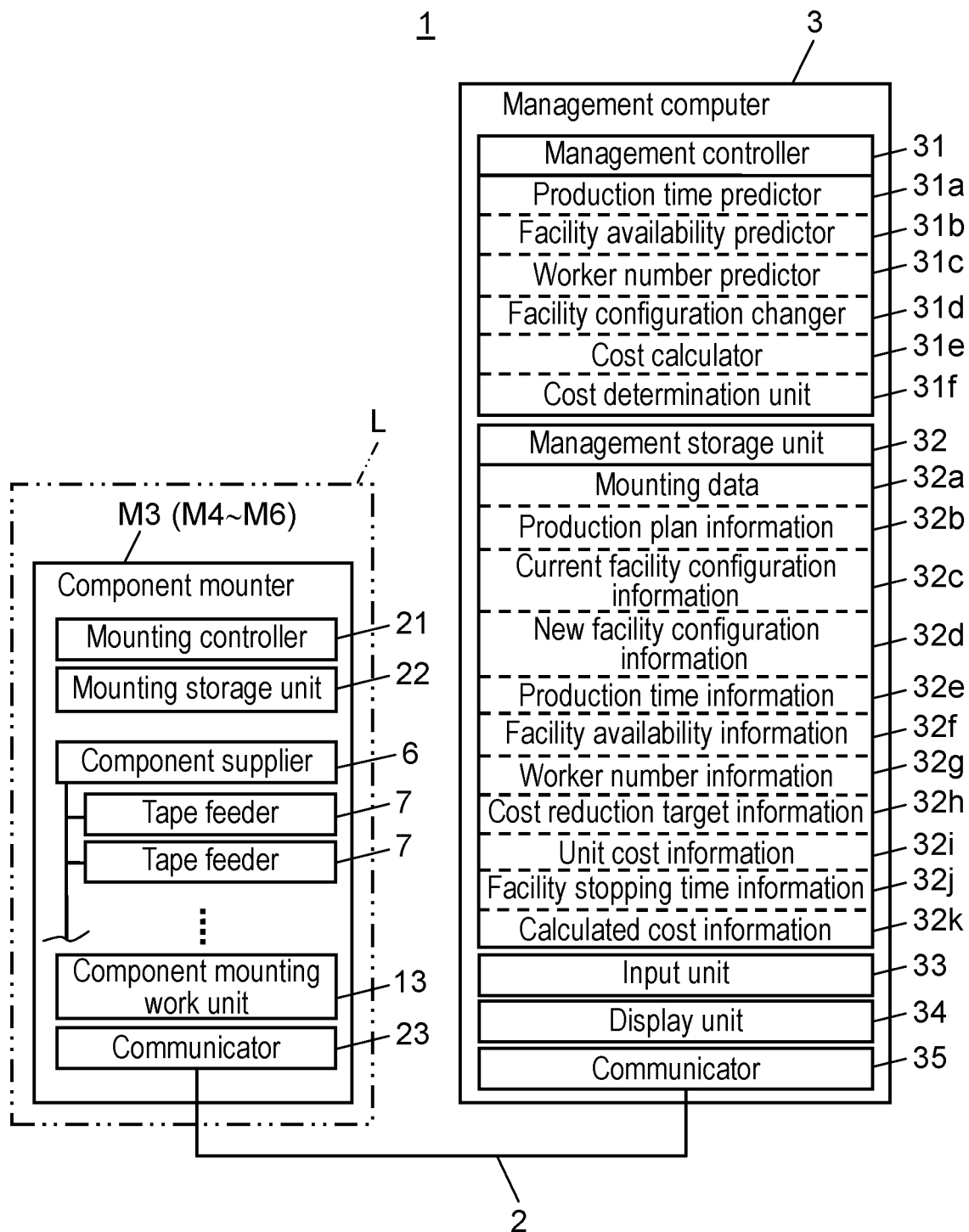
FIG. 3 is a block diagram illustrating the configuration of a control system of the component mounting system of an embodiment of the present disclosure.

In FIG. 3, mounting data 32a is data such as the component type of components D to be mounted and the mounting points on board B and is stored for each production-target board type (mounting board). A production plan which is planned in a predetermined period (for example, six months) in component mounting system 1 and which includes the type, the number, and the like of the mounting boards to be produced in component mounting line L is stored in production plan information 32b.

The facility configuration (the current facility configuration) of the devices for component mounting including component mounters M3 to M6 which configure the current component mounting line L is stored in current facility configuration information 32c. The facility configuration (the new facility configuration) of the devices for component mounting which is updated from the current component mounting line L by facility configuration changer 31d is stored in new facility configuration information 32d. The facility configurations which are stored by current facility configuration information 32c and new facility configuration information 32d include the types of mounting head 10 which are installed on component mounters M3 to M6, and the types of component supply device such as tape feeders 7 which are installed on component suppliers 6 and tray feeders. The changes to the facility configuration which are carried out by the facility configuration changer 31d include changes to the types of mounting heads 10 of component mounters M3 to M6 and changes to the component supply devices.

In FIG. 3, production time predictor 31a calculates (predicts) production time Tp which is necessary for producing the number of mounting boards which are planned using component mounting line L of a predetermined facility configuration for every mounting board based on mounting data 32a, production plan information 32b, current facility configuration information 32c, and new facility configuration information 32d. Production time Tp which is calculated is stored in management storage 32 as production time information 32e.

Facility availability predictor 31b calculates facility availability Ro which is a ratio of operation time in which component mounting line L is producing mounting boards to a time in which power is being supplied to component mounting line L. A time (non-operation time) in which power is being supplied to component mounting line L but the mounting boards are not being produced includes a setup changing time Tc which is necessary for setup changing in which the produced board type is changed, maintenance time, and the like. Facility availability predictor 31b calculates (predicts) setup changing time Tc which arises in component mounting line L of a predetermined facility configuration for every setup change based on mounting data 32a, production plan information 32b, current facility configuration information 32c, and new facility configuration information 32d. The maintenance time is predicted based on a past production record (a production log) or the like. Facility availability Ro which is calculated is stored in management storage 32 as facility availability information 32f.

Worker number predictor 31c calculates (predicts) an average personnel number (hereinafter referred to as worker number No) per day of workers which is necessary for the setup work, the component replenishment work, the maintenance work, and the like which arise in component mounting line L based on mounting data 32a, production plan information 32b, current facility configuration information 32c, and new facility configuration information 32d while cooperating with production time predictor 31a and facility availability predictor 31b. Worker number No which is calculated is stored in management storage 32 as worker number information 32g.

In FIG. 3, a cost reduction target of a time at which the facility configuration of component mounting line L is changed from the current facility configuration to a new facility configuration is input via input unit 33 and stored in cost reduction target information 32h. The device operation cost, the personnel cost of workers, the purchase cost of each of the devices for component mounting, mounting heads 10, and component supply devices, the relocation cost which is necessary for changing the facility configuration, the installation cost, the floor engineering cost, and the like per unit time when producing the mounting board in component mounting line L of a predetermined facility configuration are stored in unit cost information 32i.

The time which is necessary when changing the facility configuration of component mounting line L from the current facility configuration to the new facility configuration, that is, facility stopping time Ts in a case in which the facilities are stopped to change the facility configuration is stored in facility stopping time information 32j. Facility stopping time Ts is calculated when the facility configuration is changed by facility configuration changer 31d.

In FIG. 3, cost calculator 31e calculates production cost Cp and change cost Cc, and total cost Cs which includes production cost Cp and change cost Cc based on current facility configuration information 32c, new facility configuration information 32d, production time information 32e, facility availability information 32f, worker number information 32g, unit cost information 32i, and facility stopping time information 32j. Production cost Cp is the cost which arises when producing the mounting boards in a specific period in component mounting line L of a predetermined facility configuration (the current facility configuration or the new facility configuration). Change cost Cc is the cost which arises due to changing the facility configuration from the facility configuration of the current facility configuration to the new facility configuration.

Cost calculator 31e calculates total cost Cs as production cost Cp in consideration of at least one of production time Tp which is calculated by production time predictor 31a according to a predetermined facility configuration, facility availability Ro which is calculated by facility availability predictor 31b, and worker number No which is calculated by worker number predictor 31c. Cost calculator 31e calculates total cost Cs as change cost Cc in consideration of facility stopping time Ts in a case in which the facility configuration is changed.

Production cost Cp, change cost Cc, and total cost Cs which are calculated are stored in management storage 32 as calculated cost information 32k.

When calculating total cost Cs, cost calculator 31e may calculate the cost with several items set to fixed values even if the cost is calculated with all of production time Tp, facility availability Ro, worker number No, and facility stopping time Ts set to variable values. For example, total cost Cs may be calculated without changing the number of workers (worker number No) before and after the changing and only changing the other items. The worker is capable of setting the items which are treated as fixed values and the fixed values thereof using input unit 33 of management computer 3.

Cost determination unit 31f determines whether or not a reduction amount in total cost Cs obtained by changing the facility configuration of component mounting line L from the current facility configuration to the new facility configuration satisfies a cost reduction target based on cost reduction target information 32h and calculated cost information 32k. In other words, cost determination unit 31f determines whether or not total cost Cs is reduced by an amount greater than or equal to the cost reduction target in the new facility configuration as compared to the current facility configuration. Cost determination unit 31f determines whether or not total cost Cs is reduced in the new facility configuration as compared to the current facility configuration in a case in which a cost reduction target is not set.

Figure 4:
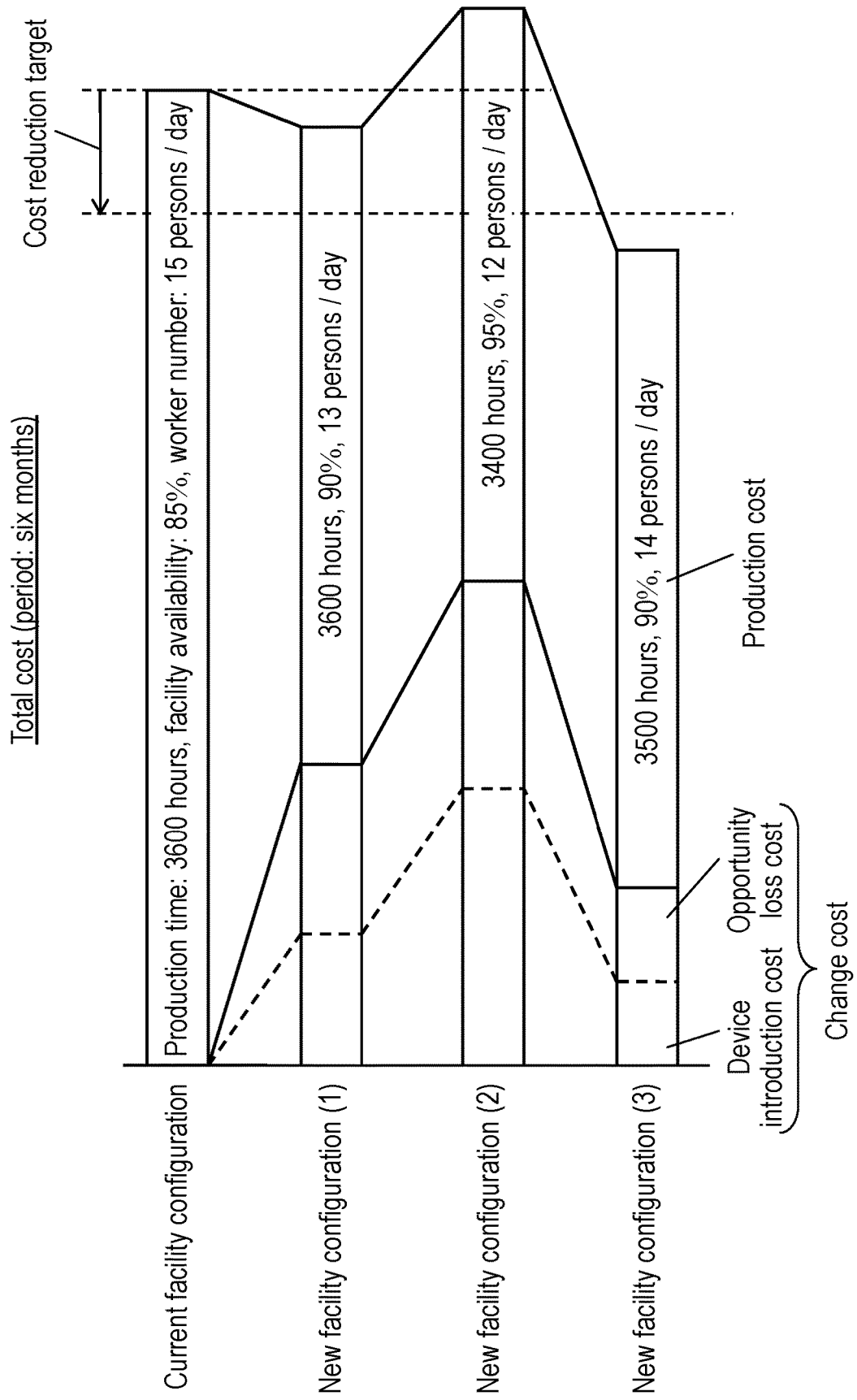
FIG. 4 is an explanatory diagram illustrating an example of a total cost which is calculated in a management computer of an embodiment of the present disclosure.

Here, a description is given of the reduction determination of production cost Cp, change cost Cc, and total cost Cs which are calculated by cost calculator 31e, and total cost Cs according to cost determination unit 31f with reference to FIG. 4. FIG. 4 illustrates examples of the costs which arise in the production in a specific period of six months in component mounting lines L of the current facility configuration and three new facility configurations (1) to (3) which are changed from the current facility configuration by facility configuration changer 31d.

In FIG. 4, change cost Cc is not included in total cost Cs of the current facility configuration and total cost Cs is entirely production cost Cp. As considered in the calculation of production cost Cp of the current facility configuration, production time Tp which is necessary for the production of the mounting boards which are planned in six months is predicted to be 3600 hours by production time predictor 31a, facility availability Ro is predicted to be 85% by facility availability predictor 31b, and worker number No is predicted to be 15 persons/day by worker number predictor 31c. Cost calculator 31e calculates production cost Cp (total cost Cs) based on these predictions.

Similarly, production time Tp which is necessary for producing the mounting boards which are planned in six months in the current facility configuration using the new facility configuration (1), the new facility configuration (2), and the new facility configuration (3) is predicted to be 3600 hours, 3400 hours, and 3500 hours, respectively, facility availability Ro is predicted to be 90%, 95%, and 90%, respectively, and worker number No is predicted to be 13 persons/day, 12 persons/day, and 14 persons/day, respectively. Production costs Cp in the new facility configuration (1), the new facility configuration (2), and the new facility configuration (3) are calculated based on these predictions.

In the new facility configurations (1) to (3), change costs Cc are also calculated by cost calculator 31e. Each change cost Cc includes a device introduction cost and an opportunity loss cost. Cost calculator 31e calculates the sum value of the costs of the devices which are purchased, the movement of devices, and the installation costs when changing from the current facility configuration to each of the new facility configurations (1) to (3) as the device introduction cost based on unit cost information 32i.

Cost calculator 31e calculates, as the opportunity loss cost, the profit which is allowed to escape due to the facilities stopping and production not being possible when changing from the current facility configuration to each of the new facility configurations (1) to (3) based on facility stopping time Ts. In other words, the opportunity loss cost is a hypothetical profit from the mounting boards which may be produced in a case in which production is performed for facility stopping time Ts without changing the facility configuration from the current facility configuration. Cost calculator 31e calculates change cost Cc which includes the device introduction cost and the opportunity loss cost and adds change cost Cc to production cost Cp to calculate total cost Cs.

In FIG. 4, in the new facility configuration (1), production cost Cp is reduced by the amount by which worker number No is reduced due to progress in work automation as compared to the current facility configuration and it is predicted that total cost Cs may also be reduced as compared to the current facility configuration. However, the cost reduction target is not satisfied. In the new facility configuration (2), it is predicted that production cost Cp is reduced by the amount by which production time Tp and worker number No are reduced due to improvements in work speed and work automation as compared to the current facility configuration. However, it is predicted that the device introduction cost, the opportunity loss cost, and change cost Cc are great and that in the total cost Cs of a specific period of six months there is an increase as compared to the current facility configuration.

In the new facility configuration (3), it is predicted that production cost Cp is reduced by the amount by which production time Tp and worker number No are reduced due to improvements in work speed and work automation as compared to the current facility configuration. Furthermore, since change cost Cc which is necessary for the improvement is smaller than in the new facility configuration (2), it is predicted that total cost Cs is reduced as compared to the current facility configuration and the cost reduction target is satisfied. Cost determination unit 31f compares total cost Cs of the current facility configuration with each total cost Cs of new facility configurations (1) to (3) and determines whether or not each reduction in total cost Cs satisfies the cost reduction target. In this example, the new facility configuration (3) satisfies the cost reduction target and the new facility configuration (3) is determined as the new facility configuration.

In this manner, facility configuration changer 31d, cost calculator 31e, cost determination unit 31f, and component mounting line L form a facility configuration creator which creates a new facility configuration in which total cost Cs is reduced as compared to continuing production with the current facility configuration when performing production in a specific period in component mounting line L. Management computer 3 which is provided with the facility configuration creator forms a facility configuration creation support system which supports the creation of the facility configuration of component mounting line L which includes component mounters M3 to M6. The facility configurations which are created by facility configuration creator are stored in management storage 32.

The facility configuration creation support system is not limited to management computer 3 which is connected to component mounting line L and communication network 2. The facility configuration creation support system may be a computer which is provided with the facility configuration creator and may not be connected to component mounting line L.

Next, a description will be given of the facility configuration creation support method which supports the creation of the facility configurations of component mounting line L which includes component mounters M3 to M6, following the flow of FIG. 5. First, the current facility configuration is set (input) (ST1: current facility configuration setting step). The current facility configuration which is set is stored as current facility configuration information 32c. Next, the production plan of the mounting boards for evaluating the facility configuration before and after the change is set (ST2: production plan setting step). Specifically, an evaluation target production plan and an evaluation target period (a specific period) which are included in production plan information 32b are specified. Next, the cost reduction target is set (ST3: target setting step). The cost reduction target is input via input unit 33 and stored as cost reduction target information 32h.

Next, cost calculator 31e calculates production cost Cp and total cost Cs of component mounting line L with the current facility configuration and stores production cost Cp and total cost Cs as calculated cost information 32k (ST4: current cost calculation step). Next, facility configuration changer 31d changes the facility configuration from the current facility configuration to the new facility configuration (ST5: facility configuration changing step). The changing of the facility configuration includes the changing of the types of mounting heads 10 of component mounters M3 to M6 and the changing of the component supply devices. Accordingly, it is possible to predict not only the addition and the updating of component mounters M3 to M6 which configure component mounting line L but also the effect of the cost reduction brought about by the updating of mounting heads 10 and the component supply devices (tape feeders 7 and tray feeders). The new facility configuration which is created is stored as new facility configuration information 32d.

Next, cost calculator 31e calculates production cost Cp, change cost Cc, and total cost Cs with the new facility configuration (ST6: new cost calculation step). In the new cost calculation step (ST6), consideration is given to facility stopping time Ts of a case in which the facility configuration is changed as change cost Cc. Accordingly, it is possible to consider the opportunity loss cost.

In the current cost calculation step (ST4) and the new cost calculation step (ST6), at least one of production time Tp, facility availability Ro, and worker number No resulting from the facility configuration is taken into account as production cost Cp. At this time, the calculation (the prediction) which is based on the facility configuration of production time Tp, facility availability Ro, and worker number No is performed by production time predictor 31a, facility availability predictor 31b, and worker number predictor 31c, respectively. Accordingly, it is possible to more accurately predict production cost Cp.

Figure 5:
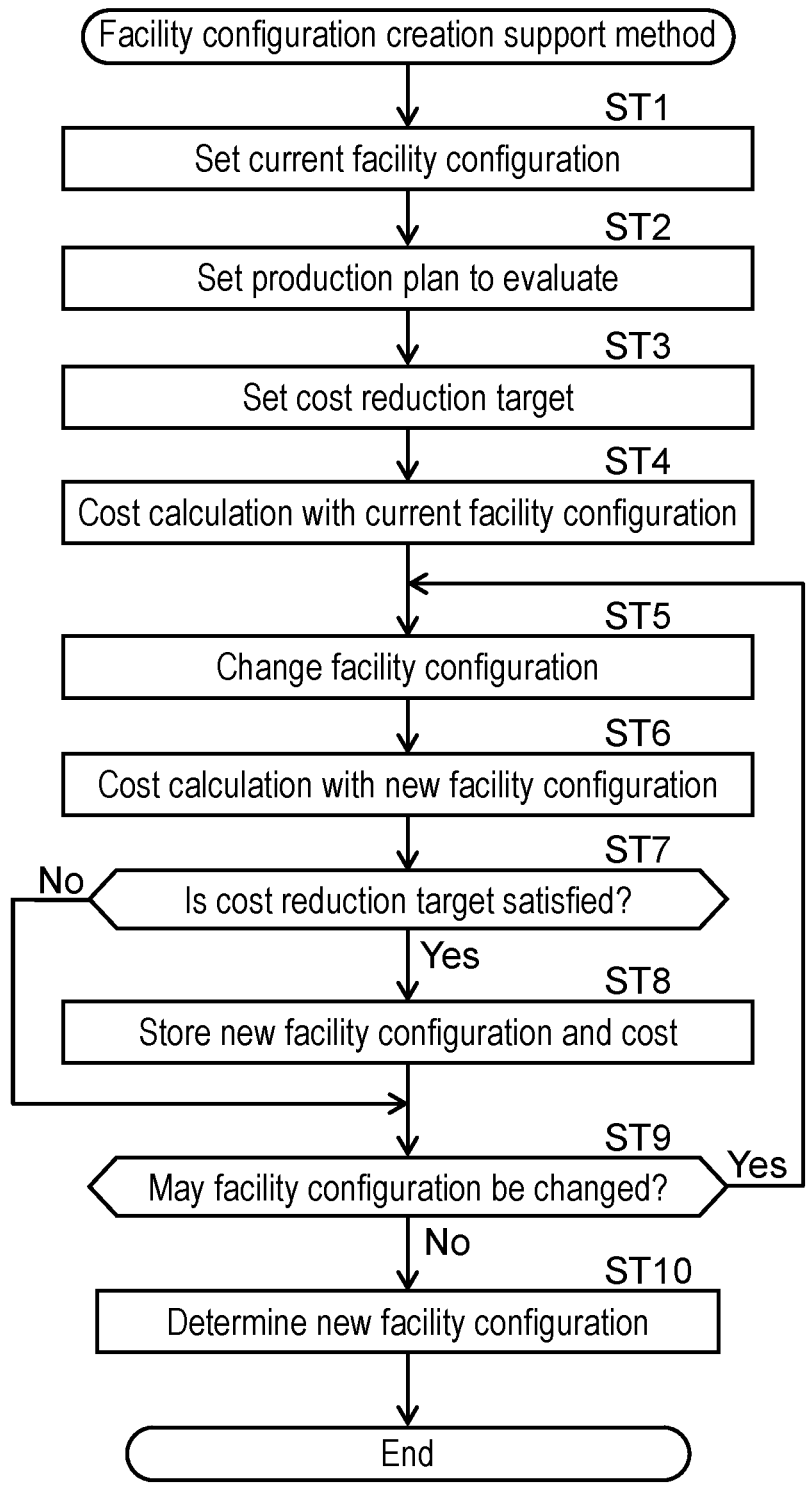
FIG. 5 is a flowchart of a facility configuration creation support method in the component mounting system of an embodiment of the present disclosure.

In FIG. 5, next, cost determination unit 31f determines whether or not total cost Cs of the new facility configuration is reduced by an amount greater than or equal to the cost reduction target as compared to the current facility configuration (ST7: cost determination step). In a case in which the cost reduction target is not set, in the cost determination step (ST7), it is determined whether or not total cost Cs is reduced in the new facility configuration as compared to a current total cost in the current facility configuration. In a case in which total cost Cs is reduced by an amount greater than or equal to the cost reduction target (Yes in ST7), production cost Cp, change cost Cc, and total cost Cs which are calculated are associated with the new facility configuration and stored as calculated cost information 32k (ST8: new cost storage step).

Next, facility configuration changer 31d determines whether another facility configuration may be changed (ST9: change possibility determination step). In a case in which total cost Cs is not reduced by an amount greater than or equal to the cost reduction target (No in ST7), the new cost storage step (ST8) is not executed and the change possibility determination step (ST9) is executed. In a case another facility configuration may be changed (Yes in ST9), the process returns to the facility configuration changing step (ST5) and another new facility configuration is created. In a case in which another facility configuration may not be changed (No in ST9), that is, after the cost reductions in all of the new facility configurations are considered, cost determination unit 31f determines the facility configuration in which total cost Cs may be most reduced as the new facility configuration based on calculated cost information 32k which is stored (ST10: new facility configuration determination step).

In this manner, from the current cost calculation step (ST4) to the new facility configuration determination step (ST10) form a facility configuration creation step which creates a new facility configuration in which total cost Cs is reduced as compared to a current total cost in continuing production with the current facility configuration when performing production in a specific period in component mounting line L. In other words, the facility configuration creation support method includes the facility configuration creation step and when the current facility configuration, the evaluation target production plan, and the cost reduction target are set (ST1 to ST3), a new facility configuration is created in the facility configuration creation step (ST4 to ST10). Accordingly, it is possible to support the creation of a facility configuration in which the cost may be reduced as compared to in the current component mounting line L.

The facility configuration which is created in the facility configuration creation step is stored in management storage 32 in the storage step.

As described above, management computer 3 of the present embodiment is a facility configuration creation support system which supports the creation of a facility configuration of component mounting line L which includes component mounters M3 to M6 and includes a facility configuration creator which creates a new facility configuration in which total cost Cs is reduced as compared to a current total cost in continuing the production with the current facility configuration when producing in a specific period in component mounting line L, and management storage 32 which stores the facility configuration which is created by the facility configuration creator. Accordingly, it is possible to support the creation of a facility configuration in which the cost may be reduced as compared to a current total cost in the current component mounting line L.

The facility configuration creation support system and the facility configuration creation support method of the present disclosure have the effect of being capable of supporting the creation of a facility configuration in which the cost may be reduced as compared to a current total cost in the current component mounting line, and are effective in the component mounting field of mounting components onto boards.

What is claimed is:

1. A facility configuration creation support system which supports creation of a facility configuration of a component mounting line, the system comprising:
    a component mounter; and
    a management computer connected to the component mounter, the management computer comprising:
        an input unit in which a cost reduction target is input;
        a cost calculator configured to calculate a production cost based on current facility configuration information; and
        a facility configuration creator which creates a new facility configuration; and
        a management storage which stores the cost reduction target information input via the input unit and the new facility configuration which is created by the facility configuration creator; and
    wherein the cost calculator calculates a production cost for the new facility configuration, a change cost which arises from changing the facility configuration from the current facility configuration to the new facility configuration, and a total cost for the new facility configuration, the total cost being the production cost for the new facility configuration plus the change cost;
    wherein the facility configuration creator determines whether a reduction from the production cost for the current facility configuration to the total cost for the new facility configuration is equal to or greater than the cost reduction target, and
    wherein when the reduction from the production cost for the current facility configuration to the total cost for the new facility configuration is equal to or greater than the cost reduction target, at least one of a type of a mounting head of the component mounter and a component supply device of the component mounter is changed from the current facility configuration to the new facility configuration, and
    the management computer communicates with a controller of the component mounter to cause the component mounter to perform the component mounting work according to the new facility configuration, and
    wherein when the reduction from the production cost for the current facility configuration to the total cost for the new facility configuration is less than the cost reduction target, the current facility configuration is maintained.

2. The facility configuration creation support system of claim 1, wherein the cost calculator, when calculating the total cost, takes a facility stopping time of a case in which the facility configuration is changed into consideration.

3. The facility configuration creation support system of claim 1, wherein the cost calculator, when calculating at least one of the production cost and the total cost includes taking at least one of production time, facility availability, and worker number according to the current or new facility configuration into consideration.

4. A facility configuration creation support method which supports creation of a facility configuration of a component mounting line which includes a component mounter, the method comprising:
    setting and inputting a cost reduction target into a management computer via an input unit;
    calculating a production cost associated with a current facility configuration;
    creating a first new facility configuration;
    calculating a total cost associated with the first new facility configuration, the total cost being a production cost associated with the first new facility configuration plus a change cost to change from the current facility configuration to the first new facility configuration;
    determining whether the difference in cost between the current facility configuration and the first new facility configuration meets the set cost reduction target; and
    when the set cost reduction target is met:
        a management storage stores the first new facility configuration and a management controller changes the current facility configuration to the first new facility configuration,
        wherein the component mounter performs a component mounting work according to the first new facility configuration, and
    when the set cost reduction is not met, the current facility configuration is not changed to the first new facility configuration.

5. The facility configuration creation support method of claim 4, wherein calculating the change cost associated with the new facility configuration includes taking a facility stopping time of a case in which the new facility configuration is changed into consideration.

6. The facility configuration creation support method of claim 4, wherein calculating the production cost associated with the new facility configuration includes taking at least one of production time, facility availability, and worker number according to the new facility configuration into consideration.

7. The facility configuration creation support method of claim 4, wherein changing the current facility configuration to the new facility configuration includes changing of a type of a mounting head of the component mounter.

8. The facility configuration creation support method of claim 4, wherein changing the current facility configuration to the new facility configuration includes changing of a component supply device of the component mounter.

9. The facility configuration creation support method of claim 4, wherein when the set cost reduction target is not met:
    creating a second new facility configuration;
    calculating a total cost of the second new facility configuration including a production cost of the second new facility configuration and a change cost to change from the current facility configuration to the second new facility configuration;
    if a difference between the production cost of the current facility configuration and a total cost of the second new facility configuration meets the set cost reduction target, changing the current facility configuration to the second new facility configuration; and
    if the difference between the production cost of the current facility configuration and the total cost of the second new facility configuration does not meet the set cost reduction target, maintaining the current facility configuration.

\* \* \* \* \*